United States Patent [19]

Lancaster

[11] Patent Number: 4,535,532
[45] Date of Patent: Aug. 20, 1985

[54] INTEGRATED CIRCUIT CONTACT TECHNIQUE

[75] Inventor: Loren T. Lancaster, Allentown, Pa.

[73] Assignee: AT&T Bell Laboratories, Murray Hill, N.J.

[21] Appl. No.: 598,179

[22] Filed: Apr. 9, 1984

[51] Int. Cl.³ .................. H01L 21/265; H01L 29/78; B01J 17/00
[52] U.S. Cl. .................... 29/576 B; 29/571; 29/577 C; 29/578; 148/1.5; 148/187; 357/91
[58] Field of Search .............. 29/576 B, 571, 577 C, 29/578; 148/1.5, 187; 29/578; 357/91

[56] References Cited

U.S. PATENT DOCUMENTS

| | | | |
|---|---|---|---|
| 4,235,011 | 11/1980 | Butler et al. | 29/571 |
| 4,342,149 | 8/1982 | Jacobs et al. | 29/576 B |
| 4,366,613 | 1/1983 | Ogura et al. | 29/571 |
| 4,406,710 | 9/1983 | Davies et al. | 148/1.5 |
| 4,411,058 | 10/1983 | Chen | 29/571 |

OTHER PUBLICATIONS

Bassous et al., IBM-TDB, 25, (1982), 3353.
Bakeman et al., IBM-TDB, 25, (1982), 3498.
Rideout, IBM-TDB, 22, (1980), 3861.

Primary Examiner—Upendra Roy
Attorney, Agent, or Firm—Peter V. D. Wilde

[57] ABSTRACT

Source-drain to substrate shorts and allied problems related to misalignment of contact windows are curable in CMOS technology by a non-selective implant into the contact windows of both types. Key to success of the technique is designing devices and masks so the problem develops on one type of device in preference to the other and tailoring the dopant levels so the non-selective implant will selectively type-convert desired regions.

14 Claims, 3 Drawing Figures

INTEGRATED CIRCUIT CONTACT TECHNIQUE

BACKGROUND OF THE INVENTION

As the size of active impurity regions in semiconductor integrated circuit substrates shrink the size of the electrical contacts to those regions likewise shrink. A limiting factor is the minimum line that can be produced in a given technology. When the impurity region is reduced to that minimum dimension the contact "window" that is made prior to forming the contact cannot, as is customary, be made smaller than the region to be contacted. As a result both features are made with the minimum feature size and the contact will almost certainly be partially non-aligned or offset with the region to be contacted. This situation is commonly referred to as "line-on-line" features, i.e. features that require minimum line on minimum line registration. Whether the alignment is visual or automatic it is not possible to make precise line-on-line features.

This difficulty can be overcome by implanting an appropriate impurity into the contact window prior to forming the contact. This produces a self-aligned contact with the region to be contacted.

As useful as this tool evidently is, it suffers when applied to CMOS technology. In that case two implants and additional masks are required because p-type impurities are required for the p-channel device windows and n-type impurities for the n-channel device windows.

A need remains for a technique for producing line-on-line contacts that can be applied to CMOS as well as other technologies.

STATEMENT OF THE INVENTION

One such technique is described and claimed in application of Ser. No. 597,924, filed Apr. 9, 1984. This application is directed to an alternative solution. It is based on two important recognitions. One, in many CMOS circuits the number of devices of each conductivity type is quite different. For example, VLSI memory devices may combine n-channel memory cells with CMOS peripheral drive and buffer circuits. Such devices may have 90% n-channel gates and only 10% p-channel. Secondly, with careful choice and control of the doping levels in the device it is possible to expose non-selectively all the source-drain windows on the chip to a single implant step, and convert the exposed channel stop in the offset portion of the windows of one conductivity type without converting the source-drain region in the window of the other conductivity type. A key to achieving this is to have the source-drain region more heavily doped than the channel stop. Having recognized these two potential properties of CMOS devices it is possible to apply a single non-selective or blanket implant to devices of both conductivity types and correct for the offset problem in the windows of devices of one conductivity type, in the most advantageous case, devices of the prevalent type. The source-drain regions of the other type of device are made large enough to avoid the offset problem.

DETAILED DESCRIPTION

Figure 1:
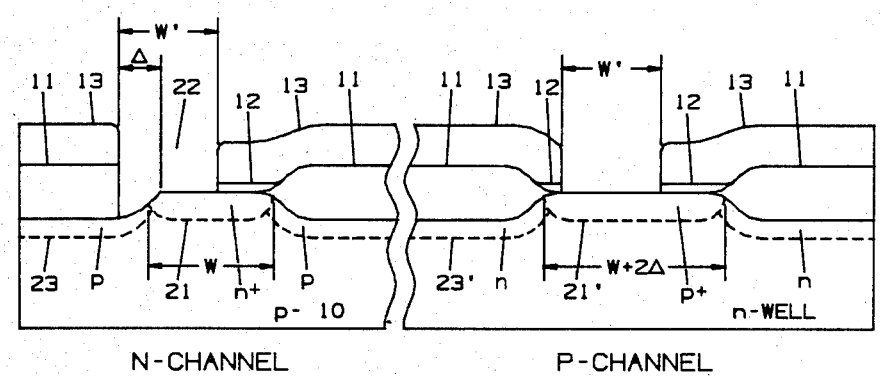
FIG. 1 is a schematic representation of a cross section of portions of an integrated CMOS chip at the point in processing showing the problem introduced by offset line-on-line contacts.

The problem that the invention addresses is illustrated in connection with FIG. 1. Reference is made to copending application of Ser. No. 597,924, filed Apr. 9, 1984 for a more detailed description of the background of the offset contact window problem that arises as a consequence of line- on-line contacts. In FIG. 1, sections of an exemplary CMOS integrated circuit chip are shown. The device on the left of the broken chip section is exemplary of an n-channel device. Typically this device may appear on the chip as part of the memory array, or as one of a CMOS pair of devices used, for example, in the peripheral memory cell support circuits or in a wide variety of logic devices. This n-channel source-drain contact is made line-on-line, which means that the width W of the source-drain region 21 is approximately the same as the width W' of contact window 22. As shown, the contact window is offset by an amount $\Delta$, which corresponds in this exemplary showing to the alignment tolerance set by the lithographic design rules. The contact may be misaligned less than $\Delta$, so shown here is the worst case. The consequence of the offset is the potential short between the contact layer that will subsequently be applied (see FIG. 3) and the channel stop region, shown at 23. That results in a short from the contact to the substrate. In a conventional CMOS pair of devices, the other device of the pair, the p-channel device, is of comparable size, and will exhibit a similar short if the source-drain contact is made line-on-line. It is evident that a non-selective implant using impurities of one conductivity type, or the other, will cure one shorting problem but not the other.

Figure 2:
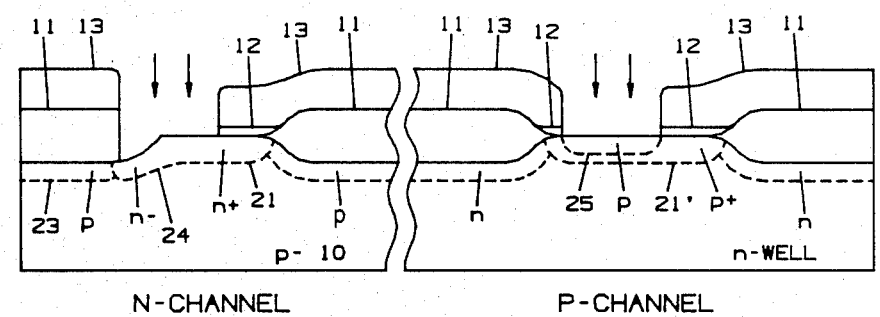
FIG. 2 is a schematic view similar to that of FIG. 1 further illustrating the proposed solution according to the invention.

The solution according to this invention is to design one type of device, in this case the p-channel devices, with source-drain contact widths of the order of $W+2\Delta$. This insures that the offset that creates the shorting problem with the n-channel devices will not create the same problem with the p-channel devices. Shown in FIG. 1 is source-drain region 21' with width $W+2\Delta$. The contact window, having a width approximately equal to W, will not expose the n-channel stop 23' and no shorting problem exists. At this point a non-selective ion implant, as shown in FIG. 2, converts the exposed channel stop in the n-channel device contact window to n-type material, thus removing the potential for shorting of the contact to the substrate. Due to careful selection of the respective doping levels between the p-type channel stop 23 and the p-type source-drain region 21', and the non-selective implant dose applied at the step represented by FIG. 2, the exposed portion of the channel stop is converted to n-type as desired, but the source-drain contact region remains p-type as desired.

Figure 3:
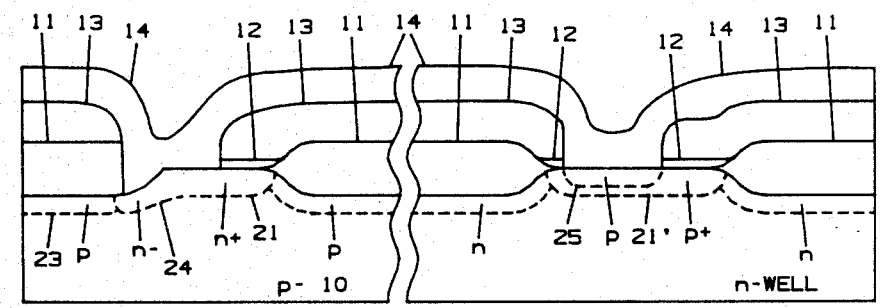
FIG. 3 shows the device of FIG. 2 with the contact layer in place.

Other elements shown in FIGS. 1-3 are essentially equivalent to those shown in the copending application referred to earlier and the description of that application is incorporated by reference herein. However, since the doping levels of certain of the regions shown in FIGS. 1-3 are especially important to the efficacy of the techniques of this invention several of the manufacturing details will be repeated here.

In FIG. 1, the substrate 10 is typically silicon having a resistivity of the order of 3–100 $\underline{\Omega}$ cm. It is designated p- with respect to the other two regions shown, p-type channel stop 23 which is relatively more heavily doped, and p-type source-drain 21' which is more heavily doped still and is designated p+. The doping level for channel stop 23 can be $10^{16}$–$10^{19}$/cm$^3$, typically $10^{16}$–$10^{17}$, and the doping level for source drain region 21' can be $10^{18}$–$10^{21}$/cm$^3$ typically $10^{19}$–$10^{20}$/cm$^3$. As indicated earlier the source-drain region is more heavily doped than the channel stop to allow the latter to be converted to n-type by the non-selective n-implant without changing the conductivity type of the source-drain region. For the purposes of this invention it is recommended that this difference be of the order of factor of >10x, and preferably of the order of 100x. Referring back to FIG. 1 the conventional insulating means 11,12 and 13, i.e. field oxide 11, regrown window oxide 12 and doped or deposited glass layer 13, are typically present as shown. Doping levels for the section containing the p-channel device are conventional. The region 21' is exposed to the non-selective n-type implant which forms region 25 (FIG. 2) and which remains p-type. To insure this, a typical implant dosage for the n-type implant would be $10^{13}$–$10^{14}$/cm$^2$. The dose required in a given case will depend on a variety of factors all well known to those skilled in the art and it is not practical here to deal specifically with all variables. The objective is straightforward, i.e. apply a dose sufficient to convert the conductivity type of the channel stop but insufficient to convert the conductivity type of source-drain region 21'. If the initial doping difference between these regions is $10^2$ a practical result would be to use a dose that would produce a doping level in region 24 (FIG. 2) that is of the order of ten times that of 23 (FIG. 1) resulting in a p-type doping level in region 25 that is of the order of ten times less than that of region 21'. Typically that implant will be arsenic or phosphorus.

FIG. 3 shows the structure of FIG. 2 with metal contact layer 14 in place.

It will be evident to those skilled in the art that structures complementary to those shown here may be treated in similar fashion. It will also be evident that while this description uses as an example source-drain contacts in a CMOS structure the need for making contacts to both n-type and p-type regions using a single mask level may arise in a variety of other contexts. Although the approach described here is especially attractive if the number of one type of contact is considerably smaller than the number of the other type, it is nevertheless useful in a device where both types are equally or nearly equally represented.

The foregoing description sets forth in detail a solution to problems arising from line-on-line contacts. In the specific case illustrated both the contact and the region to be contacted are of comparable size. A directly analogous offset problem arises when the contact region is large but circumstances dictate that the contact be placed as near as possible to the edge of that region. Therefore for the purposes of this invention line-on-line is defined as if to mean edge-on-edge, i.e. the edge of one feature, e.g. the left edge of contact window 22 in FIG. 1, aligned to the left edge of diffused region 21. The remaining edge or edges may or may not be interdependent.

Various additional modifications and deviations of the techniques described herein will occur to those skilled in the art. All variations and extensions of those techniques that rely basically on the teachings through which this invention has advanced the art are properly considered to be within the scope and spirit of this invention.

What is claimed is:

1. Technique for forming contact to semiconductor impurity regions of opposite conductivity type comprising the steps of:

forming a p-type impurity region in an n-type substrate region of a semiconductor substrate, forming an n-type impurity region in a p-type substrate region of said semiconductor substrate, forming an insulating layer over said impurity regions, forming a first opening in said insulating layer exposing at least a portion of said p-type impurity region, forming a second opening in said insulating layer exposing at least a portion of said n-type impurity region and a portion of said p-type substrate, implanting n-type impurities into said first and second openings at a level sufficient to convert the exposed portion of said p-type substrate to n-type but insufficient to convert said exposed portion of said p-type region to n-type.

2. The technique of claim 1 in which p-type impurities and n-type impurities are reversed.

3. The technique of claim 1 in which the p-type impurity region is made substantially larger than the n-type region.

4. The technique of claim 2 in which the n-type region is made substantially larger than the p-type region.

5. Technique for simultaneously forming separate windows to impurity regions of both n- and p-type in a semiconductor substrate comprising the steps of:

forming a region of a first impurity type in a portion of the substrate having the opposite conductivity type forming an insulating layer over at least a portion of the substrate said portion including said region, forming a window in said insulating layer exposing a portion of said region and a first portion of the substrate having the opposite impurity type, forming a window in said insulating layer exposing a second portion of the substrate having the opposite impurity type, said second portion having an impurity level of said opposite impurity type higher than the impurity level of the first portion, implanting into both windows simultaneously impurities of said first type to a level sufficient to convert said first portion of the substrate to the first impurity type but insufficient to convert the second portion of the first conductivity type.

6. Technique for forming contacts to complementary impurity regions in a CMOS device comprising the steps of:

forming a first region having a first impurity type in a substrate portion of the opposite impurity type, forming a second region having the opposite impurity type in a substrate portion of the first impurity type, said second region having an imprity level substantially higher than the impurity level of said substrate portion of the opposite type and second region being substantially larger than said first region, forming an insulating layer over said regions, forming a first window in said insulating layer said window exposing a portion of said first region and a portion of said substrate portion of the opposite impurity type, forming a second window in said insulating layer said second window exposing a portion of said second region, implanting impurities of said first type into both windows simultaneously at a level sufficient to convert said portion of the substrate of the opposite impurity type to said first impurity type, but insufficient to convert said second region to said first conductivity type, and forming electrical contacts to said first and second regions by depositing conductive material over said substrate and into said windows.

7. Technique of claim 6 in which the said windows are approximately the same size.

8. Technique of claim 6 in which the number of first regions is substantially larger than the number of second regions.

9. Technique of claim 6 in which the first and second regions are source/drain of the CMOS device and the portion of the substrate of the opposite conductivity type exposed by the first window is a channel stop.

10. Technique of claim 9 in which the channel stop is formed by implanting p-type impurities into a p-type portion of the substrate.

11. Technique of claim 10 in which the first region is formed by implanting n-type impurities into a p-type portion of the substrate and the second region is formed by implanting p-type impurities into an n-type portion of the substrate.

12. Method comprising:
forming a first region of a first conductivity type in a semiconductor substrate,
forming a second region of a first conductivity type in the substrate said second region having an impurity level of said first conductivity type substantially higher than the level in the said first region,
forming a region of the opposite conductivity type in the substrate,
implanting into all three regions simultaneously impurities of the opposite conductivity type at a dose sufficient to convert said first region to the opposite conductivity type but insufficient to convert the second region to the opposite conductivity type.

13. Method of claim 12 in which the first region and the region of the opposite conductivity type are contiguous.

14. Method of claim 13 in which the first conductivity type is p-type and the opposite conductivity type is n-type.

* * * * *